(12) United States Patent
Lai et al.

(10) Patent No.: US 6,881,620 B1
(45) Date of Patent: Apr. 19, 2005

(54) METHOD OF FABRICATING DEEP TRENCH CAPACITOR

(75) Inventors: Su-Chen Lai, Chiayi (TW); Chao-Hsi Chung, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/707,357

(22) Filed: Dec. 8, 2003

(30) Foreign Application Priority Data

Oct. 3, 2003 (TW) ........................................ 92127382 A

(51) Int. Cl.$^7$ ...................... H01L 21/8242; H01L 21/20
(52) U.S. Cl. ...................... 438/243; 438/246; 438/248; 438/249; 438/386; 438/389; 438/391; 438/392
(58) Field of Search ........................ 438/243, 245–249, 438/386, 388–392

(56) References Cited

U.S. PATENT DOCUMENTS

| | | | | |
|---|---|---|---|---|
| 4,872,947 A | * | 10/1989 | Wang et al. ................... 216/38 |
| 4,999,312 A | * | 3/1991 | Yoon .......................... 438/392 |
| 5,283,453 A | * | 2/1994 | Rajeevakumar ............. 257/304 |
| 6,001,684 A | * | 12/1999 | Shen ........................... 438/246 |
| 6,008,104 A | * | 12/1999 | Schrems ...................... 438/386 |
| 6,140,175 A | * | 10/2000 | Kleinhenz et al. .......... 438/243 |
| 6,207,494 B1 | * | 3/2001 | Graimann et al. .......... 438/248 |
| 6,297,089 B1 | * | 10/2001 | Coronel et al. ............. 438/246 |
| 6,331,459 B1 | * | 12/2001 | Gruening ..................... 438/243 |
| 6,344,673 B1 | * | 2/2002 | Aussilhou et al. .......... 257/301 |
| 6,670,235 B1 | * | 12/2003 | Tews et al. .................. 438/246 |
| 2002/0016035 A1 | * | 2/2002 | Wu et al. .................... 438/243 |
| 2003/0181006 A1 | * | 9/2003 | Schrems ..................... 438/243 |

OTHER PUBLICATIONS

Wolf, Ph.D., Stanley, Richard N. Tauber, Ph.D., "Chemical Vapor Deposition of Amorphous and Polycrystalline Films," Silicon Processing for the VLSI Era–vol. 1: Process Technology, Lattice Press, 1986, pp. 182–185.*

* cited by examiner

Primary Examiner—Mary Wilczewski
Assistant Examiner—Toniae M. Thomas
(74) Attorney, Agent, or Firm—Jianq Chyun IP Office

(57) ABSTRACT

A method of fabricating a deep trench capacitor is provided. A substrate with a deep trench thereon is provided. A bottom electrode is formed at a bottom of the deep trench and a capacitor dielectric layer, a first conductive layer, a protective layer and a collar layer are sequentially formed on the surface of the deep trench. The protective layer and the collar oxide layer on the surface of the first conductive layer are removed, material is deposited into the deep trench to form a material layer. A portion of the material layer is removed to form a first opening. Thereafter, collar oxide layer and the protective layer not covered by the material layer is removed. A portion of the mask layer and the protective layer on the sidewall of the first opening is removed to form a second opening. After removing the material layer, a second conductive layer and a third conductive layer are sequentially formed in the deep trench.

24 Claims, 6 Drawing Sheets

METHOD OF FABRICATING DEEP TRENCH CAPACITOR

CROSS REFERENCE TO RELATED APPLICATIONS

This application claims the priority benefit of Taiwan application serial no. 92127382, filed on Oct. 3, 2003.

BACKGROUND OF INVENTION

1. Field of the Invention

The present invention relates to a method of fabricating a dynamic random access memory (DRAM) capacitor. More particularly, the present invention relates to a method of fabricating a deep trench capacitor.

2. Description of the Related Art

In the deep sub-micron regime of semiconductor production, size of each device is greatly reduced. For dynamic random access memory (DRAM), device miniaturization means the area for accommodating each DRAM capacitor is reduced. On the other hand, an increase in the processing power of computer software demands more memory capacity to run each software program. The demand for more memory storage capacity from a smaller chip necessarily requires a modification of the method of fabricating the DRAM capacitor.

According to the structure of the capacitor, DRAM can be divided into a stack capacitor DRAM and a deep trench capacitor DRAM. With the miniaturization of semiconductor device, both the stack capacitor and the deep trench capacitor DRAM encounters increasingly difficult processing problems. Stack capacitor is currently the most conventional semiconductor capacitor. At present, means of increasing the surface area of a stack capacitor includes performing a hemi-spherical grain (HSG) process or modifying the shape of the capacitor such as forming a crown, a fin, a cylinder or a spread-out structure.

Although stack capacitor is popular, planarization is a big issue that needs to be solved before the memory device can be further miniaturized. Because deep trench capacitors are formed in a substrate, the fabrication of miniaturized memory device is easier. Nevertheless, as semiconductor devices continue to shrink, width of the trenches must be reduced accordingly. As a result, there is a corresponding increase in the aspect ratio of the trenches. With an increase in the aspect ratio, forming deep trenches with the desired profile through photolithographic and etching process and the subsequent filling of the trenches with a conductive material is increasingly difficult.

FIGS. 1A through 1D are schematic cross-sectional views showing the steps for fabricating a conventional deep trench capacitor. As shown in FIG. 1A, a substrate 100 having a patterned liner layer 102 and a patterned mask layer 104 thereon is provided. Thereafter, using the liner layer 102 and the mask layer 104 as an etching mask, a deep trench 106 is formed in the substrate 100. A bottom electrode 108 is formed at a bottom of the deep trench 106 in the substrate 100 and then a capacitor dielectric layer 110 and a polysilicon layer 112 are sequentially formed at the bottom of the deep trench 106. A collar oxide layer 114 is formed over the mask layer 104 and the surface of the deep trench 106.

As shown in FIG. 1B, an anisotropic etching process is carried out to remove the collar oxide layer 114 on the surface of the mask layer 104 and the polysilicon layer 112 to retain a collar oxide layer 114a on the sidewall of the deep trench 106. Thereafter, polysilicon material is deposited into the deep trench 106 to form a polysilicon layer 118. Due to the high level of integration, width of each deep trench 106 is increasingly narrow and hence the aspect ratio of each deep trench 106 is increasingly high. With a large aspect ratio, polysilicon material deposited into the deep trench 106 through a chemical vapor deposition process can hardly fill the entire space and a large seam 120 is thereby formed within the polysilicon layer 118.

As shown in FIG. 1C, the polysilicon layer 118 outside the deep trench 106 and a portion of the polysilicon layer 118 inside the deep trench 106 is removed to form a polysilicon layer 118a. In the process of recessing the polysilicon layer 118, the mask layer 104 is also abraded to produce some defects 116.

As shown in FIG. 1D, the collar oxide layer 114a not covered by the polysilicon layer 118a is removed. Thereafter, a polysilicon layer 122 is formed inside the deep trench 106. The polysilicon layers (112, 118a and 122) are electrically connected to form an upper electrode of the capacitor.

In the aforementioned process, although the seam 120 inside the polysilicon layer 118a can be reduced by recessing, the presence of the seam 120a often leads to electrical connectivity problems in the polysilicon layers (122 and 118a). With poor connectivity in the device, the capacitor may malfunction and lead to a breakdown of the memory cell.

Because the mask layer 104 contains defects 116 after the recessing process, planarity and uniformity of a subsequently polished surface using the mask layer 104 as a polishing stop layer is likely to be affected. Furthermore, the defects 116 may affect the recessing of the polysilicon layer and subsequent depth measurement leading to a drop in the yield of the device.

SUMMARY OF INVENTION

Accordingly, one objective of the present invention is to provide a method of fabricating a deep trench capacitor capable of reducing (or entirely eliminating) overall size of the seam in the conductive layer (the upper electrode) of a conventional deep trench capacitor.

Another objective of this invention is to provide a method of fabricating a deep trench capacitor capable of minimizing the effects caused by the planarization of the conductive material layer using a polishing stop layer with a defective profile in a conventional deep trench fabrication process. Thus, the process of recessing the polysilicon layer and subsequent depth measurement are negligibly affected.

To achieve these and other advantages and in accordance with the purpose of the invention, as embodied and broadly described herein, the invention provides a method of fabricating a deep trench capacitor. First, a substrate with a patterned liner layer and a patterned mask layer thereon, and a deep trench therein is provided. Furthermore, a bottom electrode has already been formed in the substrate at a bottom of the deep trench and a capacitor dielectric layer has already been formed on the surface of the deep trench. Thereafter, a first conductive layer is formed at the bottom of the deep trench. A protective layer is formed on the mask layer and the surface of the deep trench. The protective layer is formed in a plasma-enhanced chemical vapor deposition process. In the plasma-enhanced chemical vapor deposition process, the depositing rare on a horizontal surface is higher than on a vertical surface so that the vertical surface of the deep trench is coated with a thin protective layer. A collar oxide layer is formed on the surface of the protective layer. The protective layer and the collar oxide layer on the surface of the first conductive layer are removed. Material is deposited into the deep trench to form a material layer. A portion of the material layer inside the deep trench is removed to form a first opening such that the upper surface of the material layer is at a level higher than the liner layer. Thereafter, collar oxide layer and the protective layer not covered by the material layer is removed. A portion of the mask layer and the protective layer on the sidewall of the first opening is removed to form a second opening having a width greater than the first opening. The material layer is next removed. Conductive material is deposited into the deep trench to form a second conductive layer. A portion of the second conductive layer at the top of the deep trench is removed so that the second conductive layer only partially fills the deep trench. The collar oxide layer and the protective layer on the sidewall of the deep trench not covered by the second conductive layer are removed. Finally, conductive material is deposited into the deep trench to form a third conductive layer that completely fills the trench.

In the aforementioned method of fabricating the deep trench capacitor, a protective layer with an removal rate smaller than the collar oxide layer is formed over the mask layer. When the collar oxide layer is removed, the protective layer can serve as an etching stop layer. Furthermore, because the protective layer has a small removal rate, damages to the protective layer are minimal after the etching process. Therefore, the protective layer is able to protect the underlying mask layer so that a constant profile is always maintained. In a subsequent polishing process, the protective layer or the mask layer may serve as a polishing stop layer for providing a high degree of polishing planarity and uniformity and minimizing the effects of recessing process of polysilicon and depth measurement.

In this invention, an additional process for removing a portion of the material from the sidewall of the first opening and enlarging the first opening is provided. This process reduces the aspect ratio of the deep trench and prevents the formation of a large seam in the conductive material filling the deep trench.

This invention also provides an alternative method of fabricating a deep trench capacitor. First, a substrate with a patterned liner layer and a patterned mask layer thereon and a deep trench therein is provided. Furthermore, a bottom electrode has already been formed in the substrate at a bottom of the deep trench and a capacitor dielectric layer has already been formed on the surface of the deep trench. Thereafter, a first conductive layer is formed at the bottom of the deep trench. A collar oxide layer is formed on the mask layer and the surface of the deep trench. The collar oxide layer on the surface of the first conductive layer is removed. Material is deposited into the deep trench to form a material layer. A portion of the material layer inside the deep trench is removed to form a first opening such that the upper surface of the material layer is at a level higher than the liner layer. Thereafter, the collar oxide layer not covered by the material layer is removed. A portion of the mask layer on the sidewall of the first opening is removed to form a second opening having a width greater than the first opening. The material layer is next removed. Conductive material is deposited into the deep trench to form a second conductive layer. A portion of the second conductive layer at the top of the deep trench is removed so that the second conductive layer only partially fills the deep trench. The collar oxide layer on the sidewall of the deep trench not covered by the second conductive layer is removed. Finally, conductive material is deposited into the deep trench to form a third conductive layer that completely fills the trench.

In this invention, an additional process for removing a portion of the material from the sidewall of the first opening and enlarging the first opening is provided. This process reduces the aspect ratio of the deep trench and prevents the formation of a large seam in the conductive material filling the deep trench.

This invention also provides yet another method of fabricating a deep trench capacitor. First, a substrate with a patterned mask layer thereon and a deep trench therein is provided. Furthermore, a bottom electrode has already been formed at a bottom of the deep trench and a capacitor dielectric layer has already been formed on the surface of the deep trench. Thereafter, a first conductive layer is formed at the bottom of the deep trench. A protective layer is formed on the mask layer and the surface of the deep trench. The protective layer is formed in a plasma-enhanced chemical vapor deposition process. In the plasma-enhanced chemical vapor deposition process, the depositing rate on a horizontal surface is higher than on a vertical surface so that the vertical surface of the deep trench is coated with a thin protective layer. A collar oxide layer is formed on the surface of the protective layer. The protective layer and the collar oxide layer on the surface of the first conductive layer are removed. Conductive material is deposited into the deep trench to form a second conductive layer. A portion of the second conductive layer at the top of the deep trench is removed so that the second conductive layer only partially fills the deep trench. The collar oxide layer and the protective layer on the sidewall of the deep trench not covered by the second conductive layer are removed. Finally, conductive material is deposited into the deep trench to form a third conductive layer that completely fills the trench.

In the aforementioned method of fabricating the deep trench capacitor, a protective layer with an removal rate smaller than the collar oxide layer is formed over the mask layer. Hence, in the process of removing the collar oxide layer, the protective layer can serve as an etching stop layer. Furthermore, because the protective layer has a small removal rate, damages to the protective layer are minimal after the etching process. Therefore, the protective layer is able to protect the underlying mask layer so that a constant profile is always maintained. In a subsequent polishing process, the protective layer or the mask layer may serve as a polishing stop layer for providing a high degree of polishing planarity and uniformity and minimizing the effects of recessing process of polysilicon and depth measurement.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
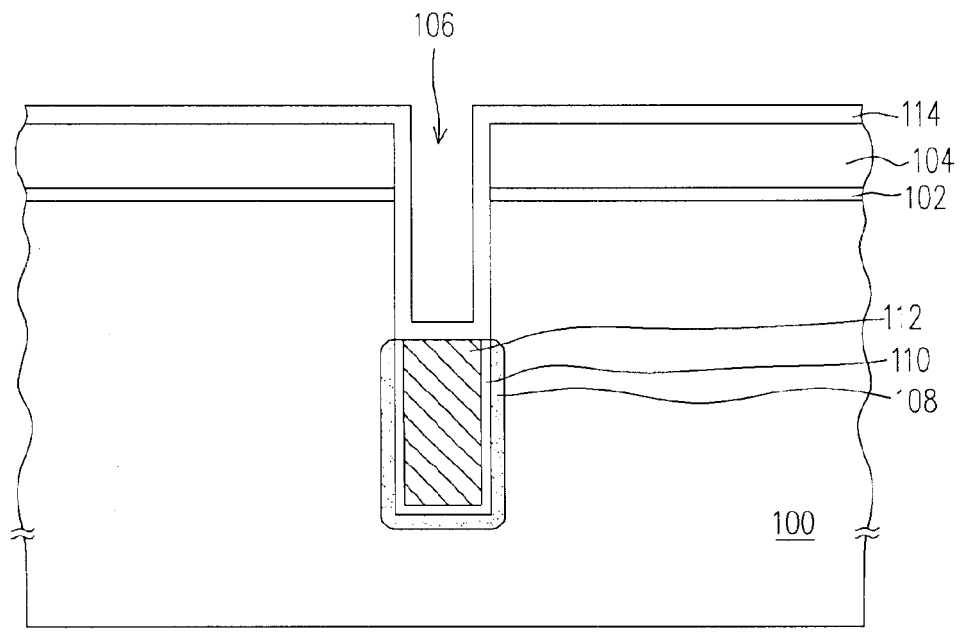
FIGS. 1A through 1D are schematic cross-sectional views showing the steps of fabricating a conventional deep trench capacitor.
Figure 1B:
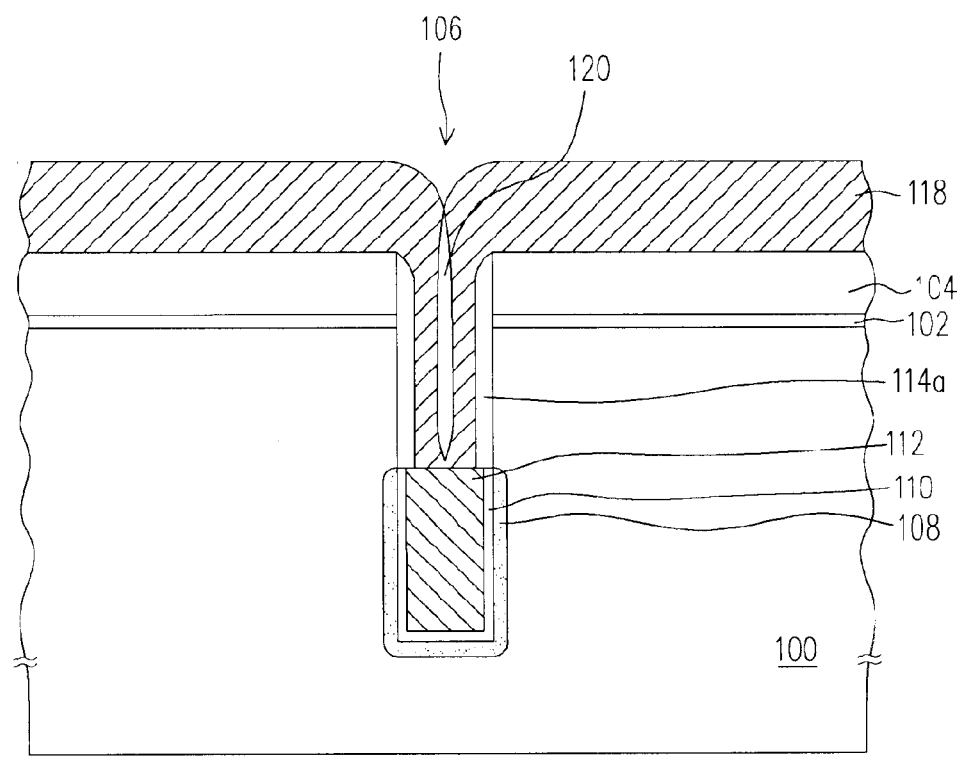
Figure 1C:
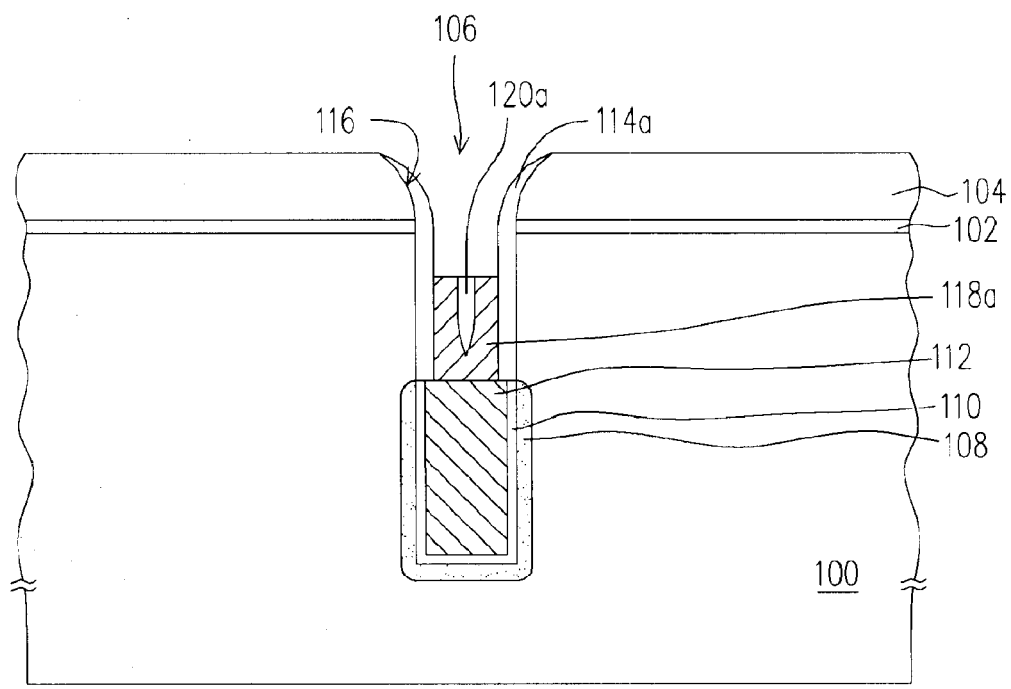
Figure 1D:
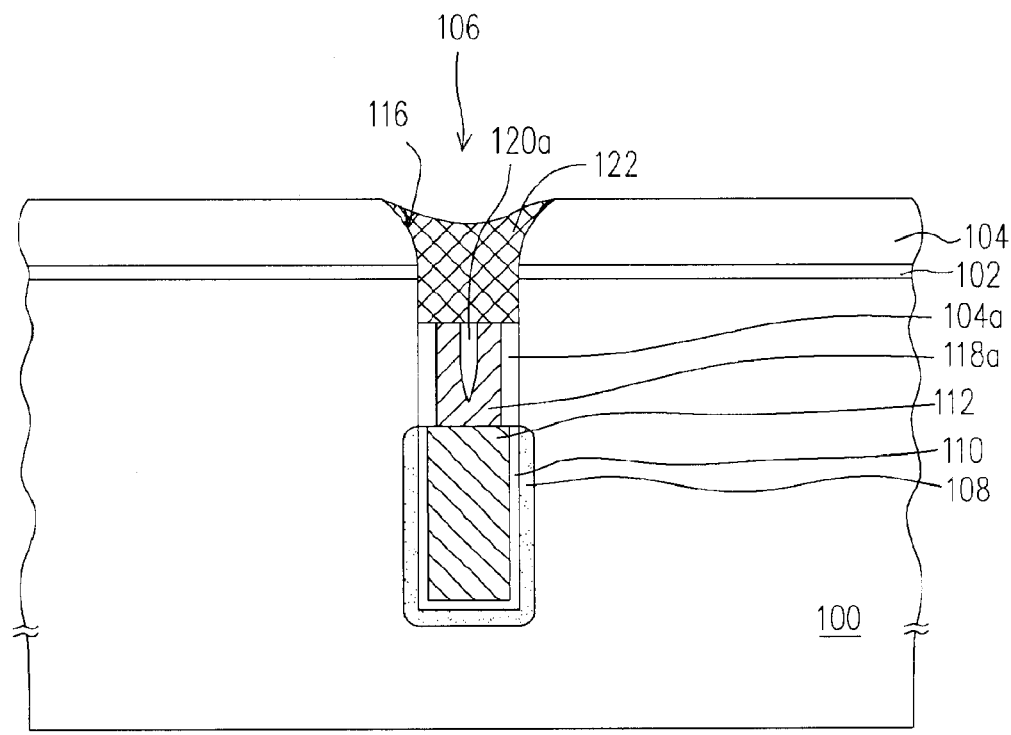

Reference will now be made in detail to the present preferred embodiments of the invention, examples of which are illustrated in the accompanying drawings. Wherever possible, the same reference numbers are used in the drawings and the description to refer to the same or like parts.

Figure 2A:
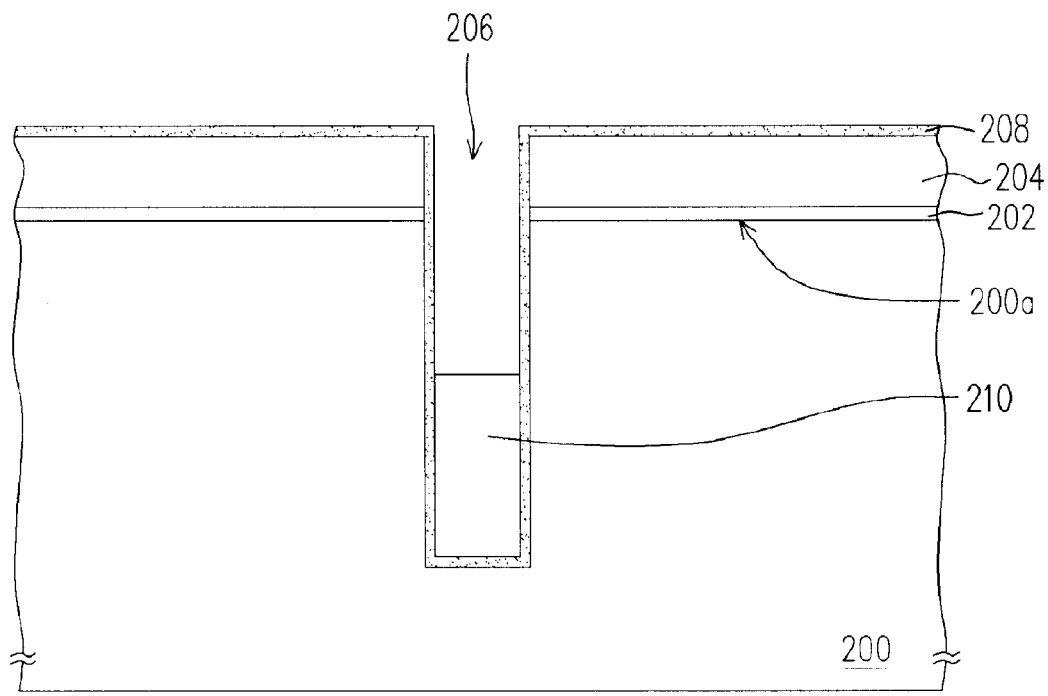
FIGS. 2A through 2H are schematic cross-sectional views showing the progression of steps of fabricating a deep trench capacitor according to one preferred embodiment of this invention.

FIGS. 2A through 2H are schematic cross-sectional views showing the progression of steps of fabricating a deep trench capacitor according to one preferred embodiment of this invention. First, as shown in FIG. 2A, a substrate 200 having a patterned liner layer 202 and a patterned mask layer 204 thereon is provided. The liner layer 202 is a silicon oxide layer and the mask layer 204 is a silicon nitride layer, for example. The patterned liner layer 202 and the mask layer 204 are formed, for example, by performing a thermal oxidation to form a liner layer 202 over the entire substrate 200, performing a chemical vapor deposition process to form a mask layer 204 over the liner layer 202 and finally carrying out a photolithographic and etching process on the mask layer 204 and the liner layer 202. Thereafter, using the mask layer 204 and the liner layer 202 as an etching mask, an etching process such as a dry etching process is carried out to form a deep trench 206 in the substrate 200. A doped insulating layer 208 is formed on the sidewall of the deep trench 206. The doped insulation layer 208 is an arsenic doped silicon oxide layer formed, for example, by performing a chemical vapor deposition process with in-situ doping. A photoresist layer 210 is formed at a bottom of the deep trench 206. The photoresist layer 210 partially fills the deep trench 206 so that the upper surface of the photoresist layer 210 is at a level well below an upper surface 200a of the substrate 200.

Figure 2B:
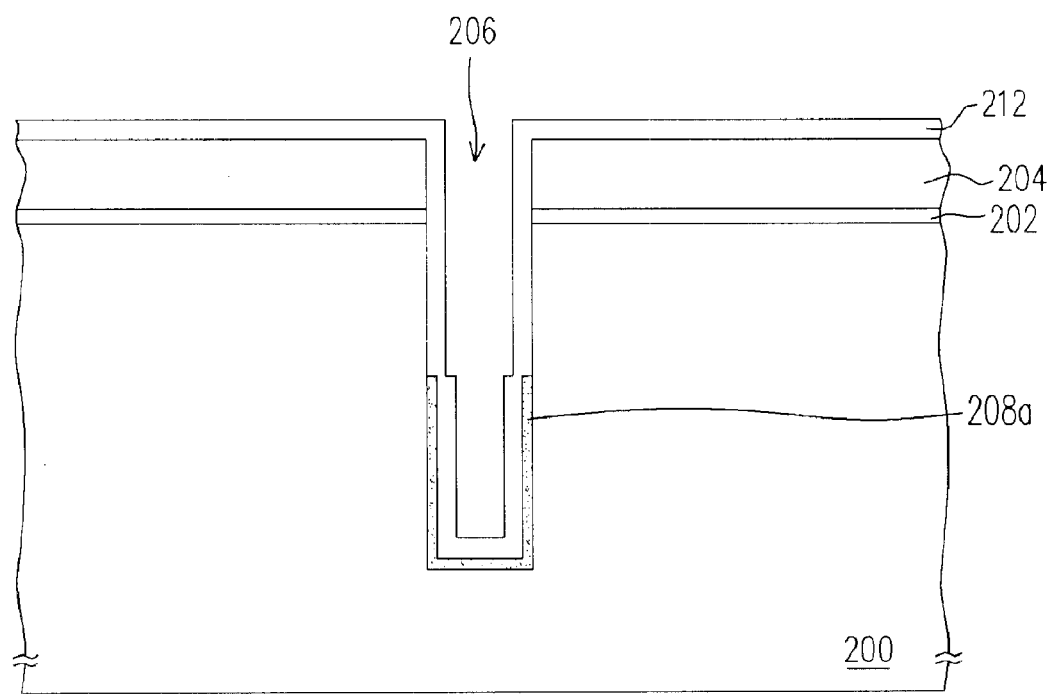

As shown in FIG. 2B, a portion of the doped insulating layer 208 not covered by the photoresist layer 210 is removed in a wet etching process using buffered hydrofluoric acid (BHF) or diluted hydrofluoric acid (diluted HF) as the etching agent. Thereafter, the photoresist layer 210 is removed and a conformal insulating layer 212 is formed over the substrate 200 to cover the mask layer 204 and the surface of the deep trench 206. The insulating layer 212 is a silicon oxide layer formed, for example, by carrying out a chemical vapor deposition process using tetraethyl-orthosilicate (TEOS)/ozone ($O_3$) as the reactive gases.

Figure 2C:
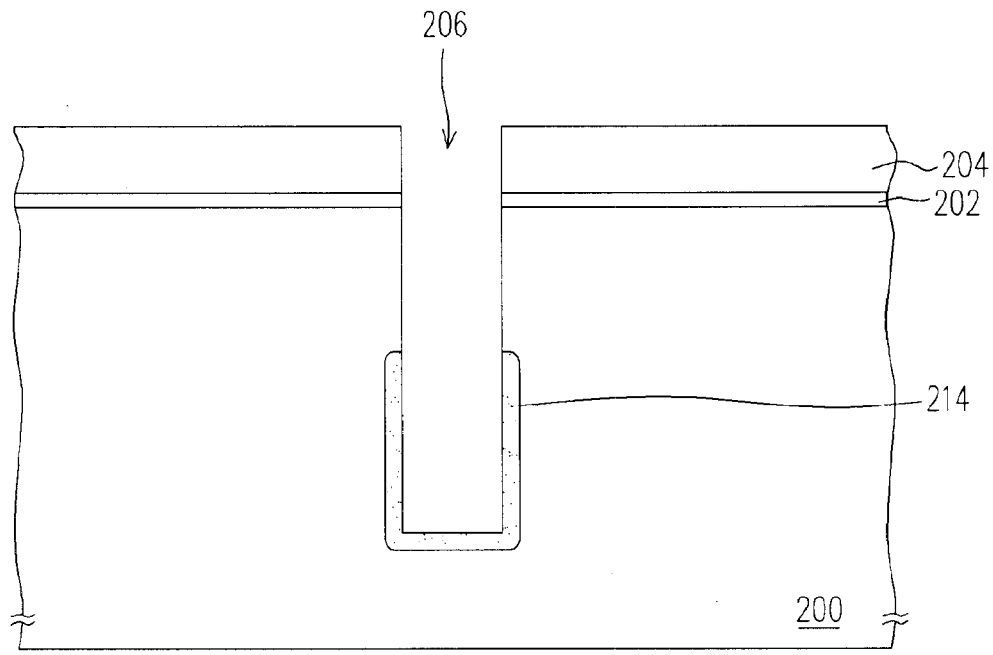

As shown in FIG. 2C, a thermal processing of the substrate 200 is carried out so that dopants within the doped insulating layer 208a diffuse into the substrate 200 at the bottom of the deep trench 206 to form a doped region 214. The doped region 214 serves as a bottom electrode in the final deep trench capacitor. Since the insulating layer 212 over the surface of the deep trench 206 is effective in stopping the outward diffusion of the dopants from the doped insulating layer 208a, the diffusion of dopants is constrained within the bottom of the deep trench 206. Thereafter, the doped insulating layer 208a and the insulating layer 212 at the bottom of the deep trench 206 are removed. The insulating layers 208a and 212 are removed, for example, by performing a wet etching process using buffered hydrofluoric acid (BHF) or diluted hydrofluoric acid (diluted HF) as the etchant.

Figure 2D:
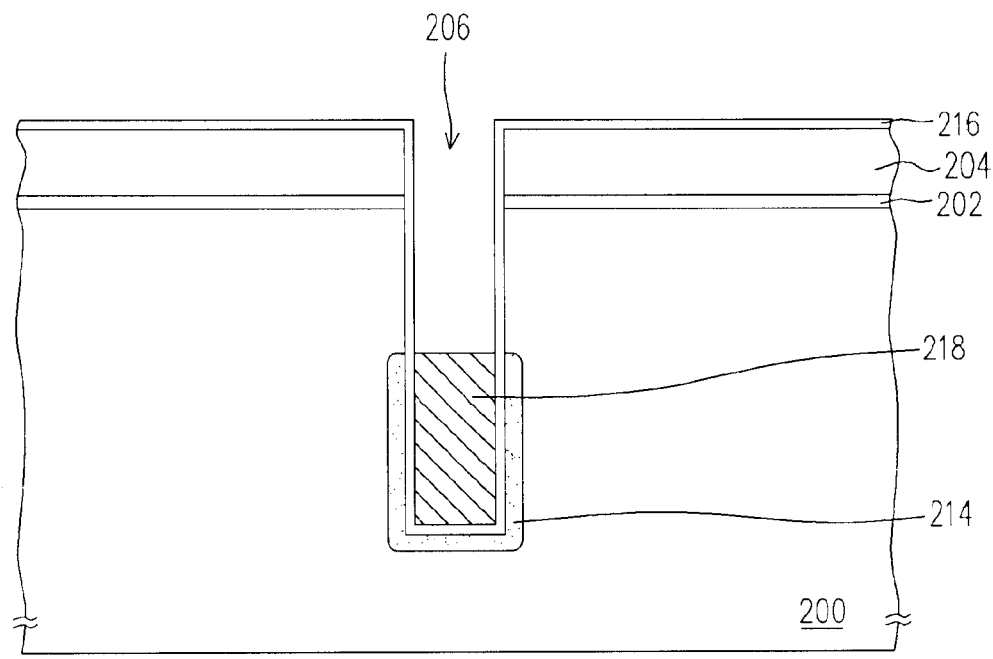

As shown in FIG. 2D, a conformal capacitor dielectric layer 216 is formed over the surface of the deep trench 206 to cover the bottom electrode 214. The capacitor dielectric layer 216 is an oxide/nitride composite layer formed by performing a thermal oxidation process or a chemical vapor deposition process, for example. Thereafter, a conductive material layer 218 is formed partially filling the deep trench 206. The conductive material layer 218 is a doped polysilicon layer formed by performing a chemical vapor deposition process with in-situ doping and then removing the doped polysilicon layer outside the deep trench 206 and a portion of the doped polysilicon layer at a top of the deep trench 206. The doped polysilicon layer is removed, for example, by performing a dry etching process or a wet etching process.

Figure 2E:
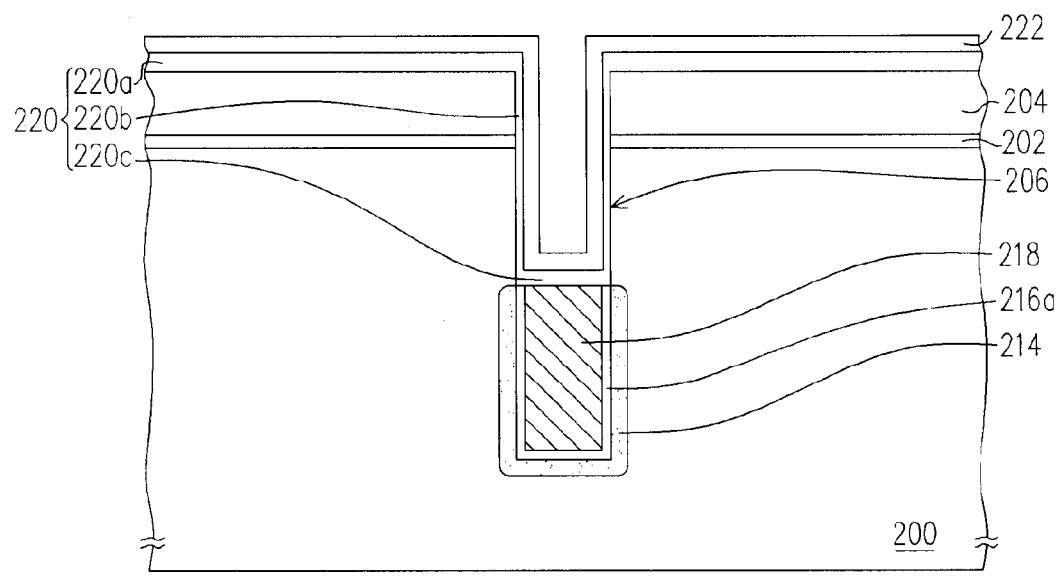

As shown in FIG. 2E, the capacitor dielectric layer 216 not covered by the conductive layer 218 is removed to form a capacitor dielectric layer 216a. The capacitor dielectric material is removed, for example, by performing a dry etching process or a wet etching process. Thereafter, a protective layer 220 is formed over the mask layer 204 and the surface of the deep trench 206. The protective layer 220 can be fabricated using a material including silicon oxide or silicon oxynitride, for example. To form a silicon oxide protective layer 220, a plasma-enhanced chemical vapor deposition process is performed using tetra-ethyl-orthosilicate (TEOS)/ozone ($O_3$) as the reactive gases. Because the depositing rate of the protective layer 220 on a horizontal surface is much greater than the depositing rate on a vertical surface, a thin protective layer 220 (220b) is formed on the vertical surface of the deep trench 206. Thus, according to the thickness of the protective layer 220, three protective layers 220a, 220b and 220c can be distinguished. The protective layer 220a is positioned over the mask layer 204, the protective layer 220b is positioned on the sidewall of the deep trench 206 and the protective layer 220c is positioned over the conductive layer 218. Furthermore, the protective layer 200a has a thickness greater than the protective layer 200c and the protective layer 200c has a thickness greater than the protective layer 200b. Thereafter, a conformal collar oxide layer 222 is formed over the protective layer 220 (220a, 220b and 220c). The collar oxide layer 222 is formed, for example, by performing a chemical vapor deposition process using ozone ($O_3$)/tetra-ethyl-ortho-silicate (TEOS) as the reactive gases.

Figure 2F:
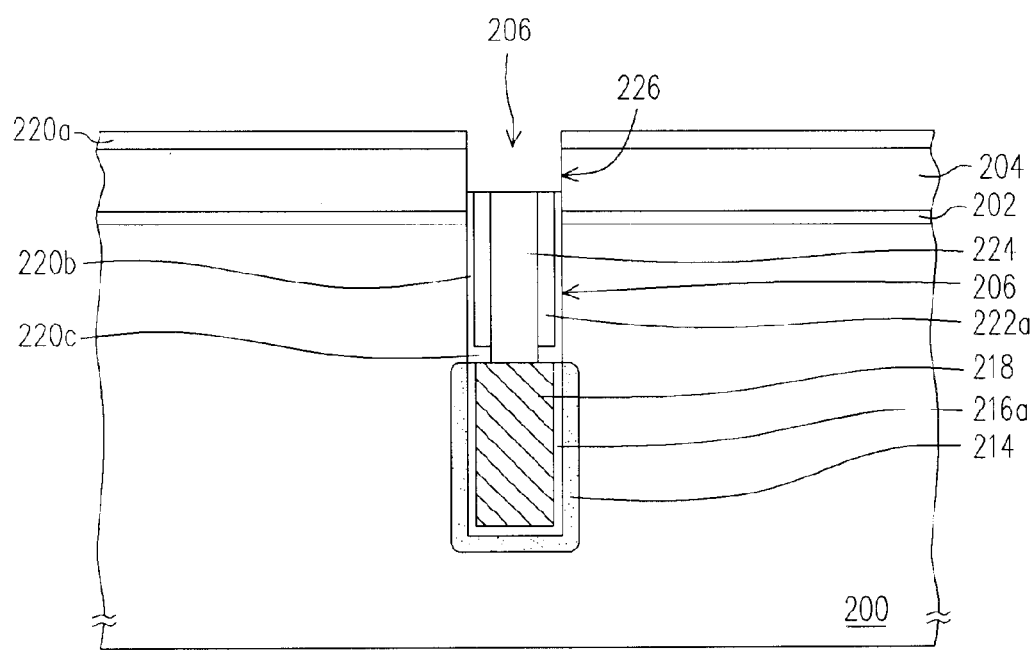

As shown in FIG. 2F, the protective layer 220c and the collar oxide layer 222 on the surface of the conductive layer 218 is removed to form a collar oxide layer 222a. Thereafter, material is deposited into the deep trench 206 to form a material layer 224 with an upper surface at a level higher than the linear layer 202. The material layer 224 is a photoresist layer or a anti-reflection coating formed, for example, by filling the deep trench 206 with the material and then recessing the material so that an opening 226 is also formed. The collar oxide layer 222a and the thin protective layer 220b on the sidewall of the deep trench 206 not covered by the material layer 224 is removed. Since the protective layer 220a has a thickness greater than the protective layer 220b, the protective layer 220a is retained after removing the protective layer 220b. The collar oxide layer 222a and the thin protective layer 220b are removed by performing a wet etching process, for example. The removal rate for the protective layers 220a and 220b is between 20 to 35 Å/min and the removal rate for the collar oxide layer 222a is between about 40 to 65 Å/min. It is to be noted that the removal rate of the protective layer 220a is considerably smaller than the collar oxide layer 222a. Hence, the protective layer 220a may serve as an etching stop layer in the removal of the collar oxide layer 222a. Because the protective layer 220a has such as a low removal rate and capacity to withstand corrosion, it protects the underlying mask layer 204 against any change in profile. In a subsequent polishing process, the protective layer 220a and the mask layer 204 may serve as a polishing stop layer for providing a high degree of polishing planarity and uniformity and minimizing the effects of recessing process of polysilicon and depth measurement.

Figure 2G:
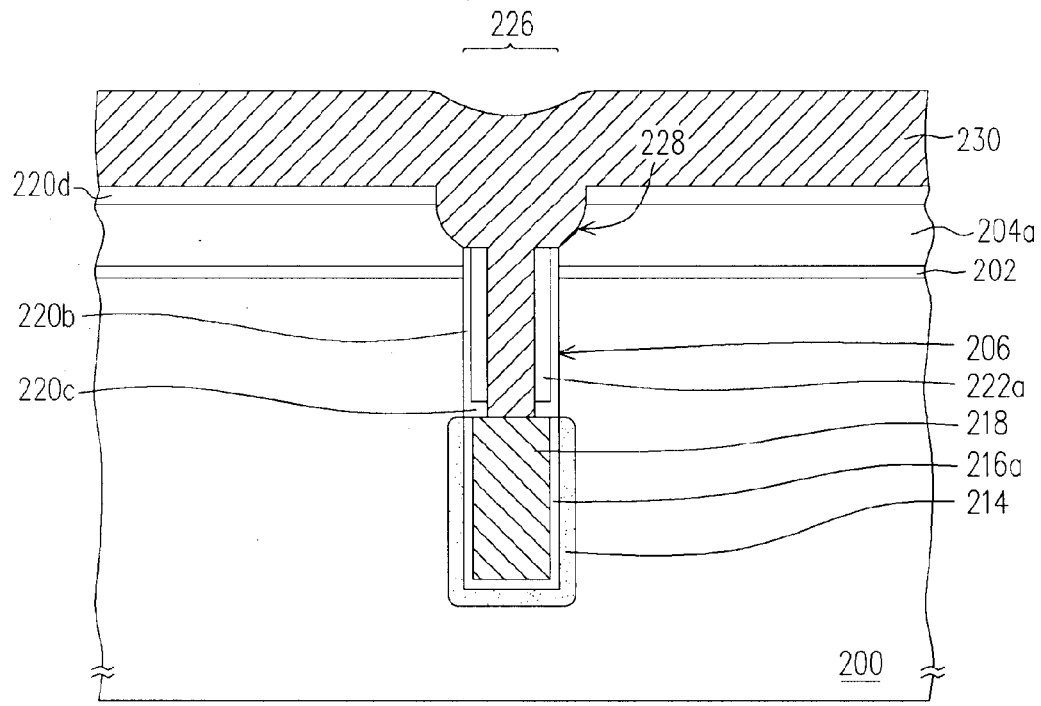

As shown in FIG. 2G, a portion of the mask layer 204 and the protective layer 220a on the sidewall of the opening 226 is removed to form a mask layer 204a, a protective layer 220d and a wider opening 228. The opening 228 is wider than the opening 226 by about 5 to 20 nm. The mask layer 204 and the protective layer 220a are removed by performing a wet etching process using hydrofluoric acid/ethylene glycol (HF/EG) or phosphoric acid ($H_3PO_4$) as the etchant, for example. Thereafter, the material layer 224 is removed by performing a wet etching process, for example. Conductive material is deposited into the deep trench 206 to form a conductive layer 230. The conductive layer 230 is a doped polysilicon layer or a polysilicon layer formed in the same way as the conductive layer 218. Furthermore, the conductive layer 218 and the conductive layer 230 are electrically connected together. Because the opening 226 has been enlarged to decrease the aspect ratio of the deep trench 206, the seam after performing a conventional conductive material deposition process is reduced (or completely eliminated) when the conductive layer 230 is formed.

Figure 2H:
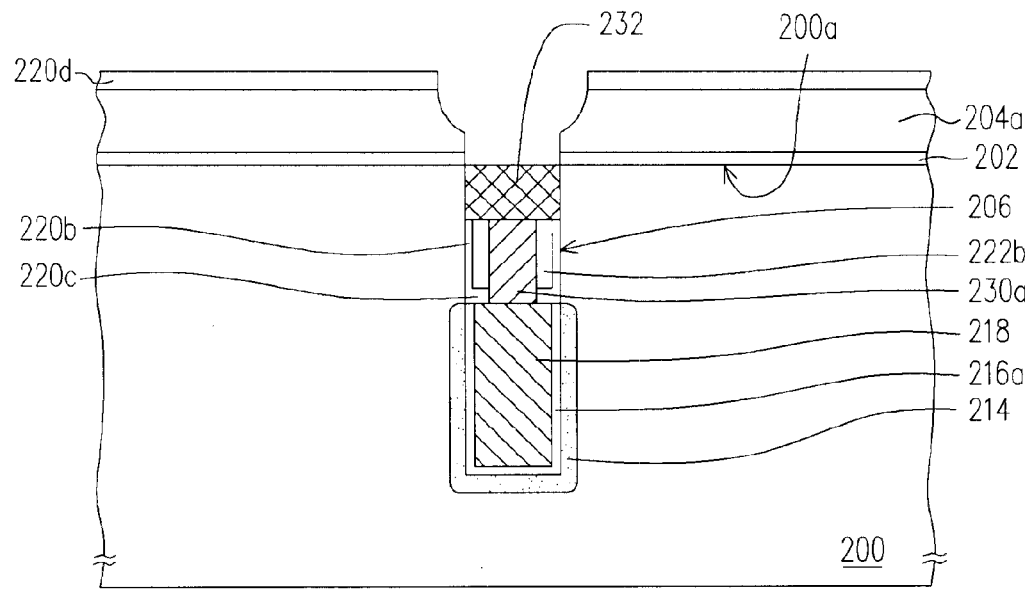

As shown in FIG. 2H, a recessing process is carried out to remove the conductive layer 230 outside the deep trench 206 and a portion of the conductive layer 230 at a top of the deep trench 206 to form a conductive layer 230a. Hence, the conductive layer 230a has an upper surface below the surface 200a of the substrate 200. Thereafter, the collar oxide layer 222a and the protective layer 220b on the sidewall of the deep trench 206 not covered by the conductive layer 230a is removed to form a collar oxide layer 222b. Another conductive layer 232 is formed inside the deep trench 206. The conductive layer 232 is a doped polysilicon layer or a polysilicon layer formed in the same way as the conductive layers (230a or 218), for example. Furthermore, all the conductive layers (218, 230a and 232) are electrically connected together to serve as a top electrode of the capacitor.

In fabricating the deep trench capacitor according to this invention, a protective layer with a removal rate smaller than the collar oxide layer is formed over the mask layer. Hence, in the process of removing the collar oxide layer, the protective layer can serve as an etching stop layer. Furthermore, because the protective layer has a small removal rate, damages to the protective layer are minimal after the etching process. Therefore, the protective layer is able to protect the underlying mask layer so that a constant profile is maintained. In a subsequent polishing process, the protective layer or the mask layer may serve as a polishing stop layer for providing a high degree of polishing planarity and uniformity and minimizing the effects of recessing process of polysilicon and depth measurement.

This invention also provides an additional step for removing a portion of the sidewall material to enlarge the first opening. This reduces the aspect ratio of the deep trench so that the large seam normally present after performing a conventional conductive material deposition process is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a trench capacitor, comprising:
   providing a substrate, wherein the substrate has a patterned liner layer and a patterned mask layer formed thereon and a trench formed therein, an electrode formed in the substrate at a bottom of the trench and a capacitor dielectric layer formed on the surface of the trench;
   forming a first conductive layer at the bottom of the trench;
   forming a protective layer over the mask layer and on the surface of the trench;
   forming a collar oxide layer on the surface of the protective layer;
   removing the protective layer and the collar oxide layer on the surface of the first conductive layer;
   depositing a material into the trench to form a material layer;
   removing a portion of the material layer inside the trench to form a first opening, wherein a top surface of the material layer is at a level higher than the liner layer;
   removing the collar oxide layer and the protective layer not covered by the material layer;
   removing a portion of the mask layer and the protective layer on the sidewall of the first opening to form a second opening, wherein the second opening has a width greater than the first opening;
   removing the material layer;
   depositing conductive material into the trench to form a second conductive layer;
   removing a portion of the second conductive layer at a top of the trench so that the second conductive layer partially fills the trench;
   removing the collar oxide layer and the protective layer on the sidewall of the trench and not covered by the second conductive layer; and
   depositing conductive material into the trench to form a third conductive layer, wherein the third conductive layer completely fills the trench.

2. The method of claim 1, wherein material constituting the protective layer is selected from a group consisting of silicon oxide and silicon oxynitride.

3. The method of claim 2, wherein the step of forming the protective layer comprises performing a plasma-enhanced chemical vapor deposition process.

4. The method of claim 1, wherein the step of forming the collar oxide layer comprises performing a chemical vapor deposition process.

5. The method of claim 4, wherein the step of performing the chemical vapor deposition process comprises using ozone/tetra-ethyl-ortho-silicate as the reactive gases.

6. The method of claim 1, wherein the protective layer has a removal rate smaller than the collar oxide layer.

7. The method of claim 6, wherein the protective layer has a removal rate between about 20 to 35 Å/min.

8. The method of claim 6, wherein the collar oxide layer has a removal rate between about 40 to 65 Å/min.

9. The method of claim 1, wherein material constituting the material layer is selected from a group consisting of photoresist and anti-reflecting coating.

10. The method of claim 1, wherein the step for removing a portion of the mask layer and the protective layer on the sidewall of the first opening comprises performing a wet etching process.

11. The method of claim 10, wherein the wet etching process is carried out using either hydrofluoric acid/ethylene glycol solution or phosphoric acid solution as the etchant.

12. The method of claim 1, wherein the second opening has a width greater than the first opening by about 5 to 20 nm.

13. A method of fabricating a trench capacitor, comprising:

provide a substrate, wherein the substrate has a patterned liner layer and a patterned mask layer formed thereon and a trench formed therein, an electrode formed in the substrate at a bottom of the trench and a capacitor dielectric layer formed on the surface of the trench;

forming a first conductive layer at the bottom of the trench;

forming a collar oxide layer on the surface of the trench and the mask layer;

removing the collar oxide layer on the surface of the first conductive layer;

depositing a material into the trench to form a material layer;

removing a portion of the material layer inside the trench to form a first opening, wherein a top surface of the material layer is at a level higher than the liner layer;

removing the collar oxide layer not covered by the material layer;

removing a portion of the mask layer on the sidewall of the first opening to form a second opening, wherein the second opening has a width greater than the first opening;

removing the material layer;

depositing conductive material into the trench to form a second conductive layer;

removing a portion of the second conductive layer at a top of the trench so that the second conductive layer partially fills the trench;

removing the collar oxide layer on the sidewall of the trench not covered by the second conductive layer; and depositing conductive material into the trench to form a third conductive layer, wherein the third conductive layer completely fills the trench.

14. The method of claim 13, wherein material constituting the material layer is selected from a group consisting of photoresist and anti-reflecting coating.

15. The method of claim 13, wherein the step for removing a portion of the mask layer on the sidewall of the first opening comprises performing a wet etching process.

16. The method of claim 15, wherein the wet etching process is carried out using either hydrofluoric acid/ethylene glycol solution or phosphoric acid solution as the etchant.

17. The method of claim 13, wherein the second opening has a width greater than the first opening by about 5 to 20 nm.

18. A method of fabricating a trench capacitor, comprising:

providing a substrate, wherein the substrate has a mask layer formed thereon and a trench formed therein, an electrode formed in the substrate at a bottom of the trench and a capacitor dielectric layer formed on the surface of the trench;

forming a first conductive layer at the bottom of the trench;

forming a protective layer over the mask layer and on the surface of the trench;

forming a collar oxide layer on the surface of the protective layer;

removing the protective layer and the collar oxide layer on the surface of the first conductive layer;

depositing conductive material into the trench to form a second conductive layer;

removing a portion of the second conductive layer at a top of the trench so that the second conductive layer partially fills the trench;

removing the collar oxide layer and the protective layer on the sidewall of the trench not covered by the second conductive layer, wherein the protective layer has a removal rate smaller than the collar oxide layer; and depositing conductive material into the deep trench to form a third conductive layer, wherein the third conductive layer completely fills the trench.

19. The method of claim 18, wherein material constituting the protective layer is selected from a group consisting of silicon oxide and silicon oxynitride.

20. The method of claim 19, wherein the step of forming the protective layer comprises performing a plasma-enhanced chemical vapor deposition process.

21. The method of claim 18, where the step of forming the collar oxide layer comprises performing a chemical vapor deposition process.

22. The method of claim 21, wherein the step of performing the chemical vapor deposition process comprises using ozone/tetra-ethyl-ortho-silicate as the reactive gases.

23. The method of claim 18, wherein the protective layer has a removal rate between about 20 to 35 Å/min.

24. The method of claim 18, wherein the collar oxide layer has a removal rate between about 40 to 65 Å/min.

* * * * *